US006538534B2

(12) United States Patent
Hirai et al.

(10) Patent No.: US 6,538,534 B2
(45) Date of Patent: Mar. 25, 2003

(54) STACKED TYPE DIELECTRIC FILTER

(75) Inventors: Takami Hirai, Aichi-Pref. (JP); Kazuyuki Mizuno, Kasugai (JP); Yasuhiko Mizutani, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/742,832

(22) Filed: Dec. 20, 2000

(65) Prior Publication Data

US 2001/0004228 A1 Jun. 21, 2001

(30) Foreign Application Priority Data

Dec. 20, 1999 (JP) .......................................... 11-360173

(51) Int. Cl.[7] ............................ H01P 1/201; H03H 7/01
(52) U.S. Cl. ........................ 333/204; 333/185; 333/219
(58) Field of Search ................................ 333/204, 238, 333/219, 116, 202, 185, 175

(56) References Cited

U.S. PATENT DOCUMENTS 6,236,290 B1 * 5/2001 Abe et al. ................... 333/185
6,310,525 B1 * 10/2001 Nakakubo et al. .......... 333/204

FOREIGN PATENT DOCUMENTS

| | | |
|---|---|---|
| EP | 0 774 797 A2 | 5/1997 |
| JP | 11-55003 | 2/1999 |
| JP | 11-150436 | 6/1999 |
| JP | 11-284406 | 10/1999 |

* cited by examiner

*Primary Examiner*—Benny Lee
*Assistant Examiner*—Stephen E. Jones
(74) *Attorney, Agent, or Firm*—Burr & Brown

(57) ABSTRACT

A stacked dielectric filter includes two sets of resonators arranged in a dielectric substrate constructed by laminating a plurality of dielectric layers, in which each of the resonators includes at least two resonance electrodes superimposed in a stacking direction. One of the resonance electrodes of the two resonance electrodes for constructing each of the resonators is formed to have a wide width as compared with the other resonance electrode. Accordingly, even when stacking deviations occur in the plurality of resonance electrodes during the production process, it is possible to decrease the variation of characteristics. Thus, it is possible to maximally exhibit the effect (high Q value, small size, and high performance) to be obtained by constructing the resonator by superimposing the plurality of resonance electrodes in the stacking direction.

4 Claims, 11 Drawing Sheets

FIG. 11A - Prior Art
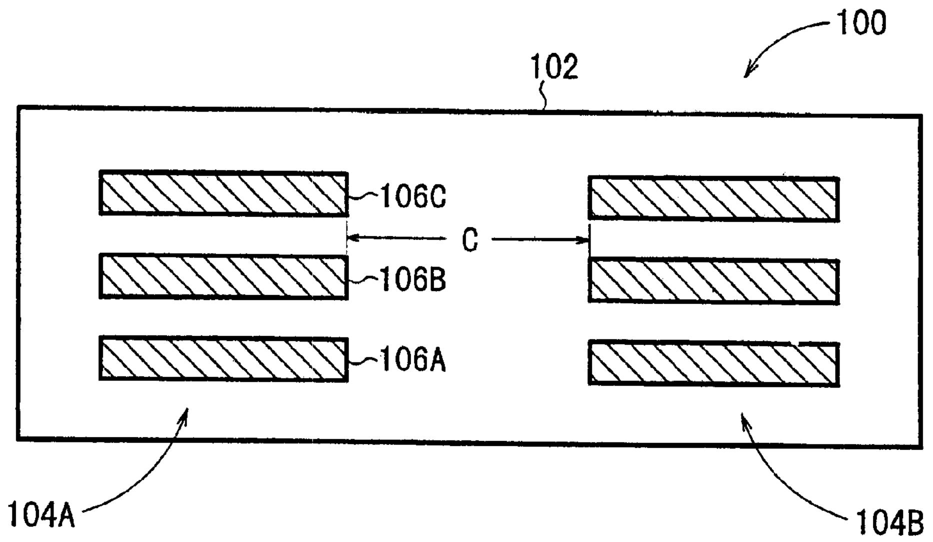
FIG. 11B - Prior Art
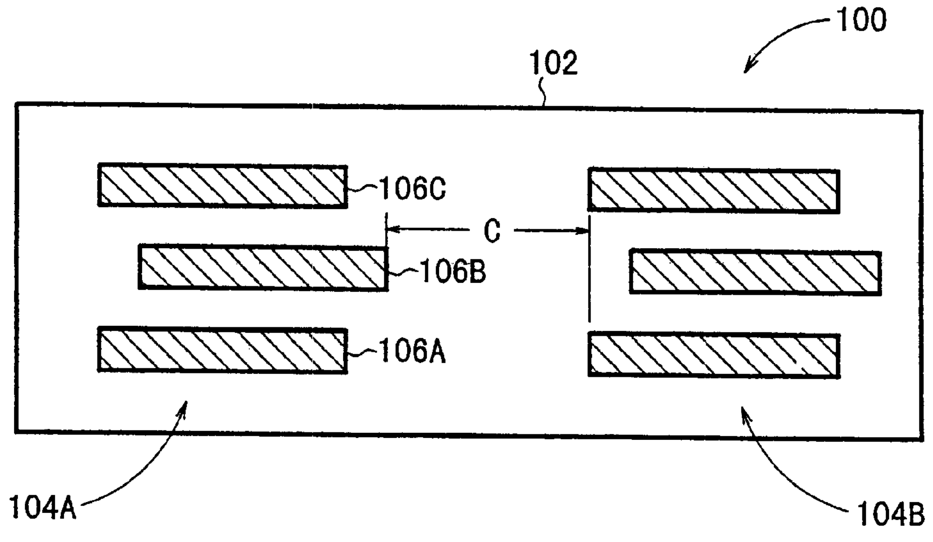

STACKED TYPE DIELECTRIC FILTER

BACKGROUND OF THE INVENTION

1. Field of the Invention

The present invention relates to a stacked type dielectric filter in which a resonance electrode is formed in a dielectric substrate constructed by laminating a plurality of dielectric layers.

2. Description of the Related Art

Recently, as the wireless communication system such as portable telephones is diversified, the demand is increased for the realization of a stacked type dielectric filter having a small size and a filter for the wireless system having a low frequency. In view of such a trend, in the conventional stacked type dielectric filter, the Q value of the resonator is improved and the electrostatic capacity between the resonance electrodes is increased by superimposing the plurality of resonance electrodes in the stacking direction so that a high performance filter having a small size is realized.

A conventional stacked type dielectric filter 100 is shown in FIG. 11A. The stacked type dielectric filter 100 comprises two sets of resonators (first and second resonators 104A, 104B) which are arranged in a dielectric substrate 102. Each of the resonators 104A, 104B comprises, for example, three sheets of resonance electrodes 106A to 106C which are superimposed in the stacking direction. A dielectric layer is allowed to intervene between the resonance electrodes 106A and 106B in the stacking direction. A dielectric layer is allowed to intervene between the resonance electrodes 106B and 106C in the stacking direction.

However, in the case of the conventional stacked type dielectric filter 100, the resonance electrodes 106A to 106C having an identical width are superimposed in the stacking direction. Therefore, the following problem arises. That is, for example, as shown in FIG. 11B, the spacing distance C between the resonators 104A, 104B is changed due to stacking deviations arising during production, and the inductive coupling between the resonators 104A, 104B is changed. When the spacing distance C between the resonators 104A, 104B is shortened, the inductive coupling between the resonators 104A, 104B is strengthened.

FIG. 11B is illustrative of a case in which the resonance electrode 106B at the second layer is deviated in the rightward direction. In this case, the spacing distance C between the resonators 104A, 104B is the distance between one long side (long side opposed to the second resonator 104B) of the second resonance electrode 106B of the first resonator 104A and one long side (long side opposed to the first resonator 104A) of the first or third resonance electrode 106A or 106C of the second resonator 104B. It is understood that the spacing distance is shortened by an amount of the stacking deviation as compared with the normal spacing distance C shown in FIG. 11A.

For example, in the case of a stacked type dielectric filter of the capacitive coupling type in which the attenuation pole is in a low band as compared with a pass band, when the inductive coupling is strengthened, the pass band width of the filter is narrowed. In the case of a stacked type dielectric filter of the inductive coupling type in which the attenuation pole is in a high band as compared with a pass band, when the inductive coupling is strengthened, the pass band width of the filter is widened.

As described above, the conventional stacked type dielectric filter involves such a problem that it is difficult to obtain desired characteristics due to the stacking deviation during the production.

SUMMARY OF THE INVENTION

The present invention has been made taking the foregoing problems into consideration, an object of which is to provide a stacked type dielectric filter which makes it possible to decrease the variation of characteristics even when stacking deviations occur in a plurality of resonance electrodes during production and which makes it possible to maximally exhibit the effect (high Q value, small size, and high performance) to be obtained by constructing a resonator by superimposing the plurality of resonance electrodes in the stacking direction.

According to the present invention, there is provided a stacked type dielectric filter comprising at least two sets of resonators arranged in a dielectric substrate constructed by laminating a plurality of dielectric layers, in which the resonator includes a plurality of resonance electrodes superimposed in a stacking direction; wherein at least one resonance electrode of the plurality of resonance electrodes for constructing the resonator is formed to have a wide width as compared with the other resonance electrode.

Accordingly, even when stacking deviations occur when the plurality of resonance electrodes are stacked, the other electrode is included in the wide-width resonance electrode as viewed in plan view. Therefore, the spacing distance between the resonators is dominated by the spacing distance between the wide-width resonance electrodes of the respective resonators. Even when stacking deviations occur in the other resonance electrode, then the spacing distance between the resonators is scarcely changed, and the inductive coupling is scarcely changed as well.

As described above, in the stacked type dielectric filter according to the present invention, even when stacking deviations occur in the plurality of resonance electrodes during production, it is possible to decrease the variation of characteristics. It possible to maximally exhibit the effect (high Q value, small size, and high performance) to be obtained by constructing the resonator by superimposing the plurality of resonance electrodes in the stacking direction.

In the stacked type dielectric filter constructed as described above, it is preferable that a stacking deviation amount, which is brought about when the plurality of resonance electrodes for constructing the resonator are stacked so that respective central positions are coincident with each other, is smaller than a protruding amount of the resonance electrode having the wide width with respect to the other resonance electrode.

It is preferable that when a number of the resonance electrodes for constructing the resonator is an odd number; a resonance electrode, which is located at a center in the stacking direction, is the resonance electrode having the widest width.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 11A shows a vertical sectional view illustrating a state in which a stacked type dielectric filter concerning the illustrative conventional technique is cut along the short side of resonance electrodes; and FIG. 11B shows a vertical sectional view illustrating a state in which the stacking deviation occurs in a conventional stacked dielectric filter.

DETAILED DESCRIPTION OF THE DRAWINGS

Several illustrative embodiments of the stacked type dielectric filter according to the present invention will be explained below with reference to FIGS. 1 to 10.

Figure 1:
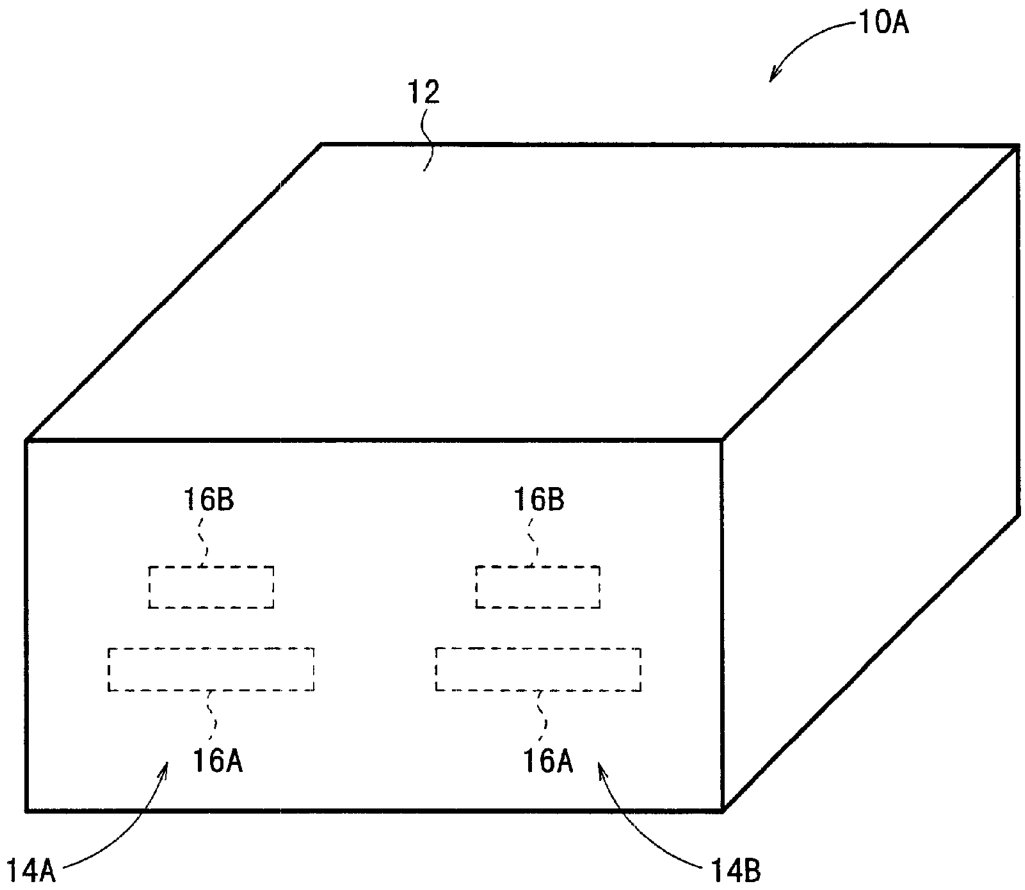
FIG. 1 shows a perspective view illustrating a stacked type dielectric filter according to a first embodiment.

At first, as shown in FIG. 1, a stacked type dielectric filter 10A according to a first embodiment comprises two sets of resonators (first and second resonators 14A, 14B) which are arranged in a dielectric substrate 12 constructed by laminating a plurality of dielectric layers. Each of the resonators 14A, 14B includes, for example, two sheets of resonance electrodes 16A, 16B which are superimposed in the stacking direction. The dielectric layer is allowed to intervene between the respective resonance electrodes 16A, 16B in the stacking direction.

Figure 2:
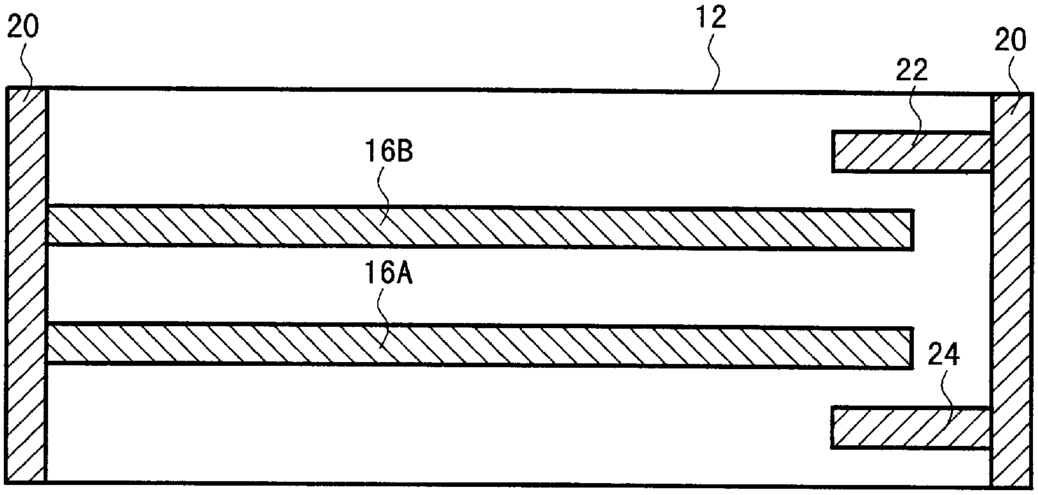
FIG. 2 shows a longitudinal sectional view illustrating a state in which the stacked type dielectric filter is cut along the long side of resonance electrodes when the resonance electrodes of ¼ wavelength are used.

As shown in FIG. 2, when the resonance electrodes 16A, 16B are ¼ wavelength resonance electrodes, a structure is adopted, in which a ground electrode 20 is formed on a surface on which the resonance electrodes 16A, 16B are exposed, and first ends of the respective resonance electrodes 16A, 16B are short-circuited with the ground electrode 20. In this arrangement, open ends of the respective resonance electrodes 16A, 16B are capacitively coupled to the ground electrode 20 by the aid of internal ground electrodes 22, 24. Accordingly, it is possible to shorten the electric length of the respective resonance electrodes 16A, 16B.

Figure 3:
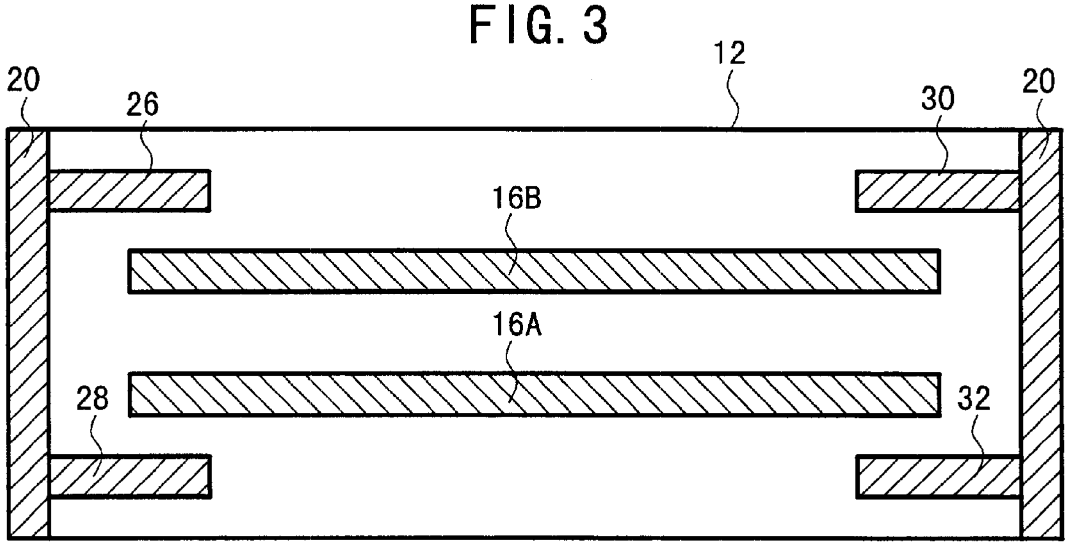
FIG. 3 shows a longitudinal sectional view illustrating a state in which the stacked type dielectric filter is cut along the long side of resonance electrodes when the resonance electrodes of ½ wavelength are used.

As shown in FIG. 3, when the resonance electrodes 16A, 16B are ½ wavelength resonance electrodes, a structure is adopted, in which the respective resonance electrodes 16A, 16B are not exposed from the side surface of the dielectric substrate 12, and both ends of the respective resonance electrodes 16A, 16B are capacitively coupled to a ground electrode 20 by the aid of internal ground electrodes 26, 28, 30, 32 respectively.

In the stacked type dielectric filter 10A according to the first embodiment, the width is widened for the first resonance electrode 16A of the two resonance electrodes 16A, 16B which constitute each of the resonators 14A, 14B. The embodiment shown in FIG. 1 is illustrative of a case in which the resonance electrode 16A arranged on the lower side is formed to have a wide width.

Figure 4A:
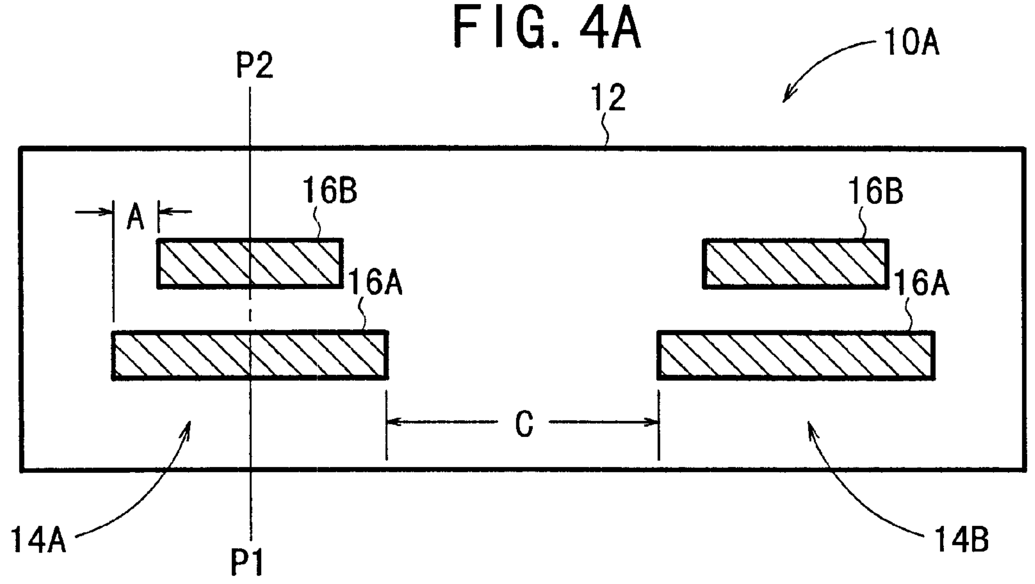
FIG. 4A shows a vertical sectional view illustrating a state in which the stacked type dielectric filter according to the first embodiment is cut along the short side of the resonance electrodes.
Figure 4B:
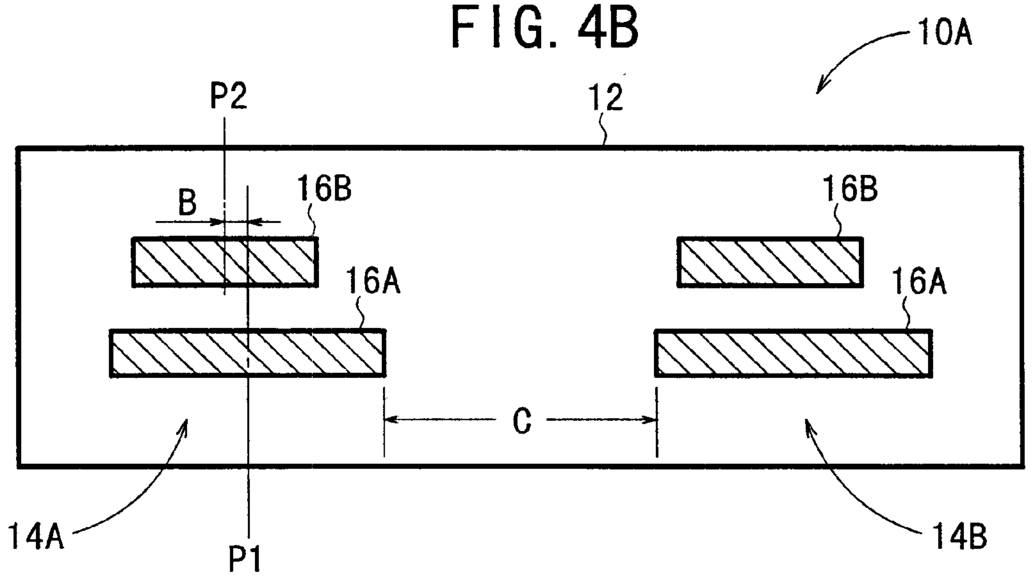
FIG. 4B shows a vertical sectional view illustrating a state in which the stacking deviation occurs.

In this arrangement, as shown in FIG. 4A, when the two resonance electrodes 16A, 16B are stacked so that the respective central positions P1, P2 are coincident with each other (ideal stacking), A≧B is satisfied, provided that A represents the protruding amount of the wide-width resonance electrode 16A with respect to the other resonance electrode 16B, and B represents the stacking deviation amount brought about in the actual stacking (maximum stacking deviation amount actually caused for the other resonance electrode 16B with respect to the wide-width resonance electrode 16A) as shown in FIG. 4B.

As described above, in the stacked type dielectric filter 10A according to the first embodiment, the first resonance electrode 16A of the two resonance electrodes 16A, 16B for constructing each of the resonators 14A, 14B is formed to have the wide width as compared with the second resonance electrode 16B. Therefore, even when stacking deviations occur when the plurality of resonance electrodes 16A, 16B are stacked, the second resonance electrode 16B is included in the wide-width resonance electrode 16A as viewed in plan view.

Especially, in the first embodiment, as shown in FIGS. 4A and 4B, the relationship of "protruding amount A≧maximum stacking deviation amount B" is satisfied. Therefore, even when stacking deviations occur, the second resonance electrode 16B is necessarily included in the wide-width resonance electrode 16A as viewed in plan view.

Therefore, the spacing distance C between the resonators 14A, 14B is dominated by the spacing distance between the wide-width resonance electrodes 16A of the respective resonators 14A, 14B. Even when stacking deviations occur in the plurality of resonance electrodes 16A, 16B, then the spacing distance C between the resonators 14A, 14B is scarcely changed, and the inductive coupling is scarcely changed as well.

As described above, in the stacked type dielectric filter 10A according to the first embodiment, even when stacking deviations occur in the plurality of resonance electrodes 16A, 16B during production, it is possible to decrease the variation of characteristics. It possible to maximally exhibit the effect (high Q value, small size, and high performance) to be obtained by constructing the resonator 14A, 14B by superimposing the plurality of resonance electrodes 16A, 16B in the stacking direction.

Next, a stacked type dielectric filter 10B according to a second embodiment will be explained with reference to FIGS. 5A and 5B. Components or parts corresponding to those shown in FIGS. 4A and 4B are designated by the same reference numerals, duplicate explanation of which will be omitted.

Figure 5A:
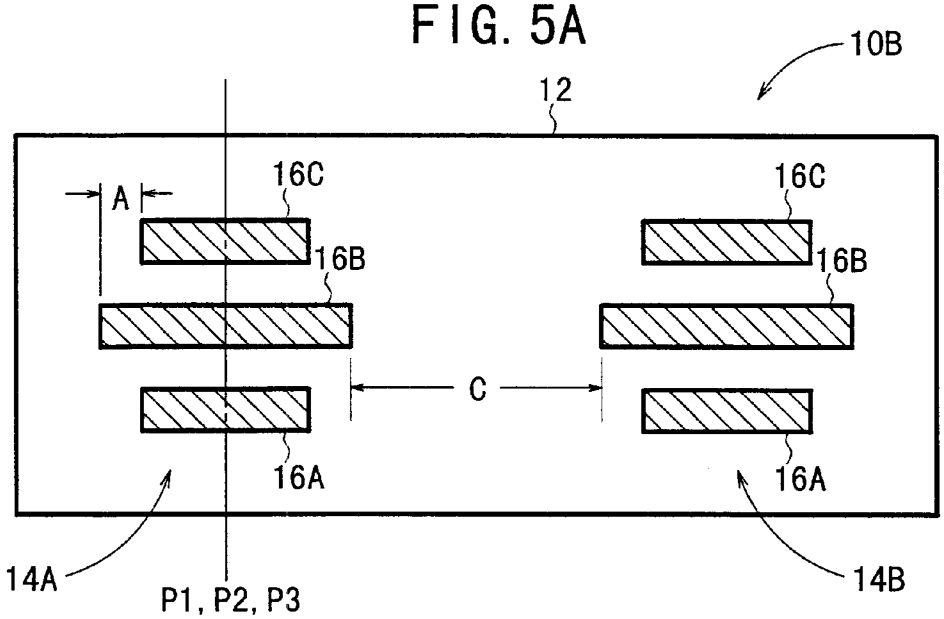
FIG. 5A shows a vertical sectional view illustrating a state in which a stacked type dielectric filter according to a second embodiment is cut along the short side of resonance electrodes.

As shown in FIG. 5A, the stacked type dielectric filter 10B according to the second embodiment is constructed in approximately the same manner as the stacked type dielectric filter 10A according to the first embodiment. However, the former is different from the latter in that each of resonators 14A, 14B is constructed by three sheets of resonance electrodes (first to third resonance electrodes 16A to 16C), and the second resonance electrode 16B of the three resonance electrodes 16A to 16C, which is disposed at the center in the stacking direction, is formed to have the widest width.

Figure 5B:
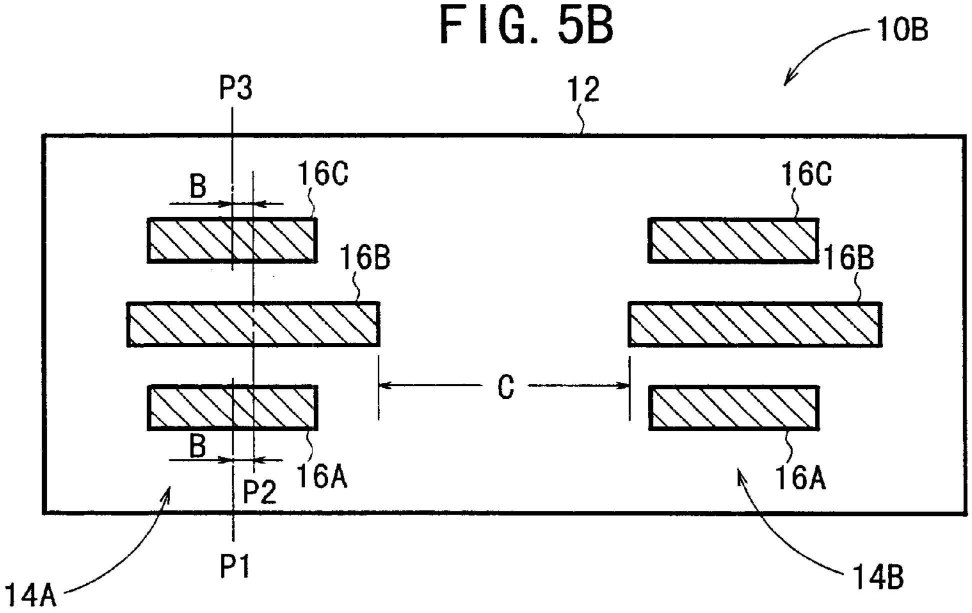
FIG. 5B shows a vertical sectional view illustrating a state in which the stacking deviation occurs.

Also in this arrangement, as shown in FIG. 5A, when the three resonance electrodes 16A to 16C are stacked so that the respective central positions P1 to P3 are coincident with each other (ideal stacking), $A \geqq B$ is satisfied, provided that A represents the protruding amount of the second resonance electrode (wide-width resonance electrod) 16B with respect to the first and third resonance electrodes 16A, 16C, and B represents the stacking deviation amount brought about in the actual stacking (maximum stacking deviation amount actually caused for the first and third resonance electrodes 16A, 16C with respect to the second resonance electrode 16B) as shown in FIG. 5B.

Also in the stacked type dielectric filter 10B according to the second embodiment, the spacing distance C between the resonators 14A, 14B is dominated by the spacing distance between the wide-width resonance electrodes 16B of the respective resonators 14A, 14B, in the same manner as in the stacked type dielectric filter 10A according to the first embodiment. Even when stacking deviations occur in the plurality of resonance electrodes 16A to 16C, then the spacing distance C between the resonators 14A, 14B is scarcely changed, and the inductive coupling is scarcely changed as well.

Next, a stacked type dielectric filter 10C according to a third embodiment will be explained with reference to FIGS. 6A to 7B. Components or parts corresponding to those shown in FIGS. 5A and 5B are designated by the same reference numerals, duplicate explanation of which will be omitted.

Figure 6A:
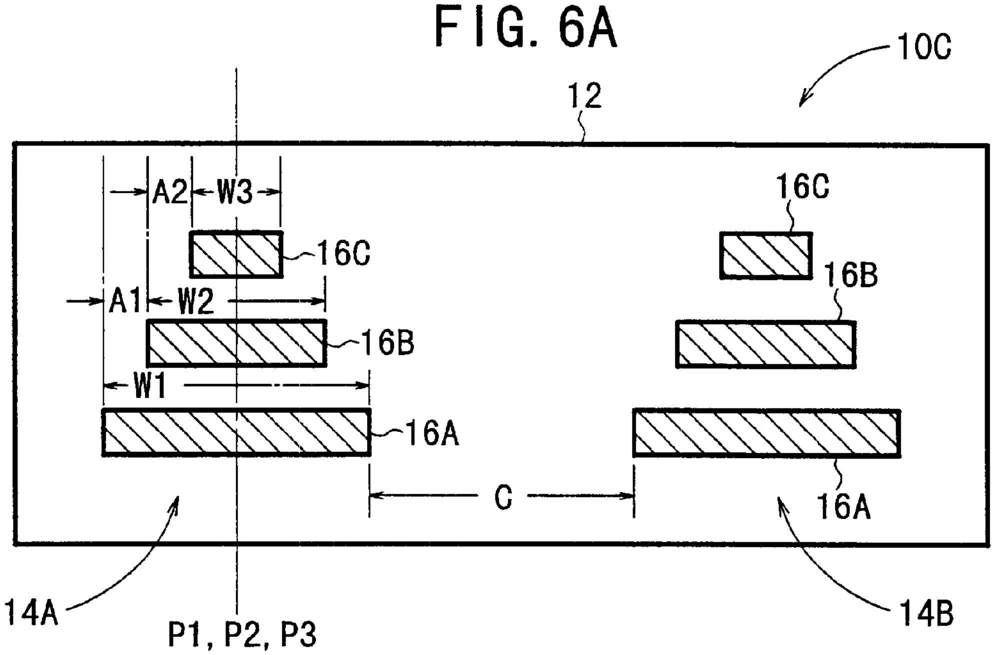
FIG. 6A shows a vertical sectional view illustrating a state in which a stacked type dielectric filter according to a third embodiment is cut along the short side of resonance electrodes.

As shown in FIG. 6A, the stacked type dielectric filter 10C according to the third embodiment is constructed in approximately the same manner as the stacked type dielectric filter 10B according to the second embodiment. However, the former is different from the latter in that a first resonance electrode 16A, which is formed on the lowermost side, is designed to have the widest width. In this arrangement, assuming that respective widths of the first to third resonance electrodes 16A to 16C are W1 to W3 respectively, a relationship of $W1>W2>W3$ may be satisfied as shown in FIG. 6A, or a relationship of $W1>W2\approx W3$ may be satisfied as in a stacked type dielectric filter 10C according to a modified embodiment shown in FIG. 7A.

Figure 6B:
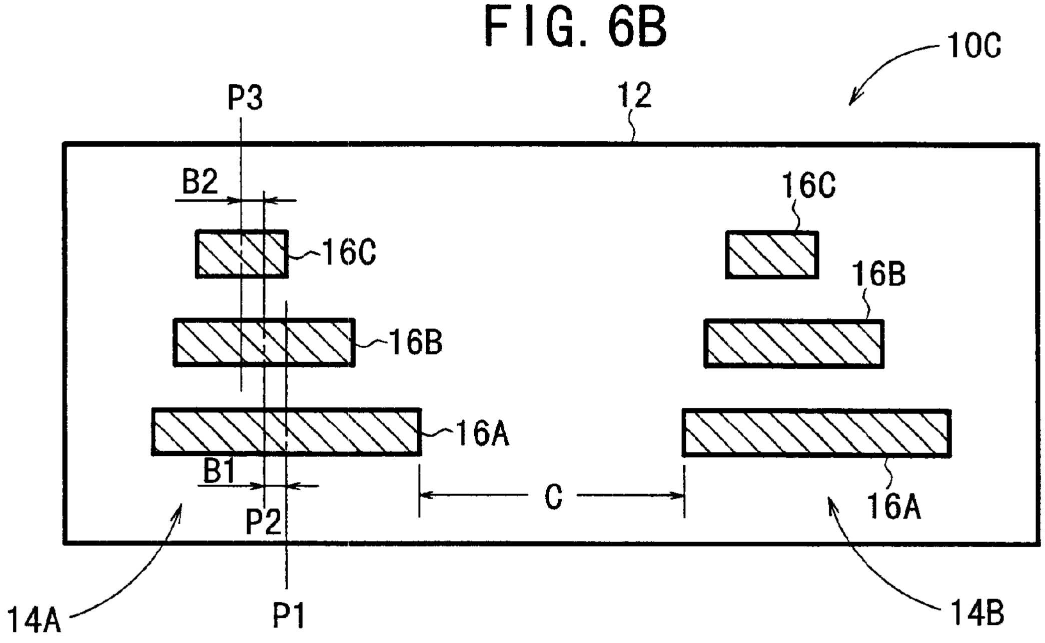
FIG. 6B shows a vertical sectional view illustrating a state in which the stacking deviation occurs.

In the embodiment shown in FIG. 6A, when the three resonance electrodes 16A to 16C are stacked so that the respective central positions P1 to P3 are coincident with each other (ideal stacking), $A1>B1$ is satisfied, provided that A1 represents the protruding amount of the first resonance electrode (wide-width resonance electrode) 16A with respect to the second resonance electrode 16B, and B1 represents the stacking deviation amount brought about in the actual stacking (maximum stacking deviation amount actually caused for the second resonance electrode 16B with respect to the first resonance electrode 16A) as shown in FIG. 6B.

As shown in FIG. 6A, when the ideal stacking is performed, $A2 \geqq B2$ may be satisfied, provided that A2 represents the protruding amount of the second resonance electrode 16B with respect to the third resonance electrode 16C, and B2 represents the stacking deviation amount brought about in the actual stacking (maximum stacking deviation amount actually caused for the third resonance electrode 16C with respect to the second resonance electrode 16B) as shown in FIG. 6B. However, this relationship is arbitrarily satisfied.

Also in the stacked type dielectric filter 10C according to the third embodiment, the spacing distance C between the resonators 14A, 14B is dominated by the spacing distance between the wide-width resonance electrodes 16A of the respective resonators 14A, 14B, in the same manner as in the stacked type dielectric filter 10A according to the first embodiment. Even when stacking deviations occur in the other resonance electrodes 16B, 16C, then the spacing distance C between the resonators 14A, 14B is scarcely changed, and the inductive coupling is scarcely changed as well.

Figure 7A:
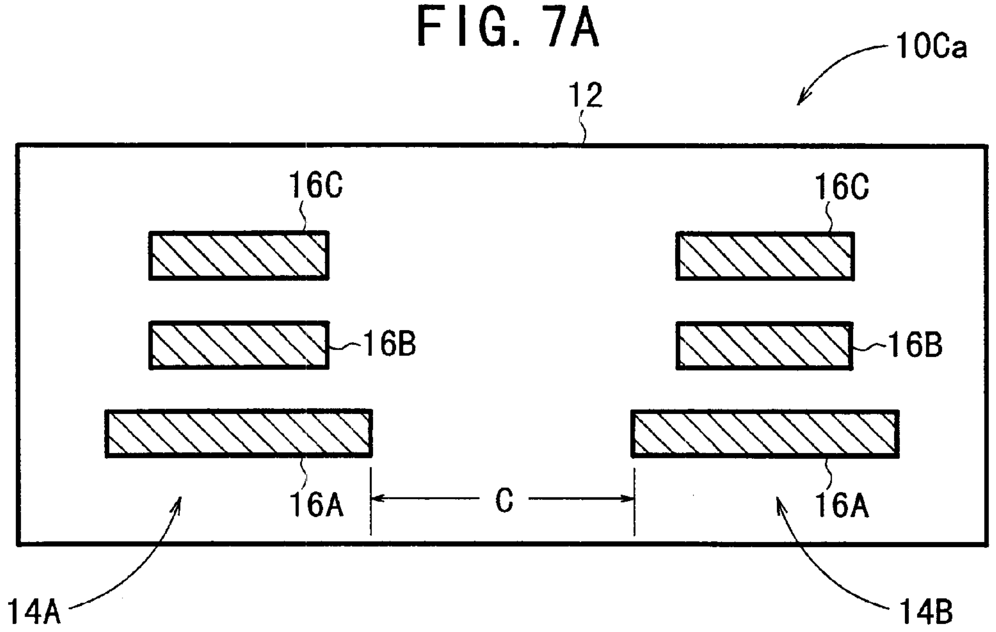
FIG. 7A shows a vertical sectional view illustrating a state in which a stacked type dielectric filter according to a modified embodiment of the third embodiment is cut along the short side of resonance electrodes.
Figure 7B:
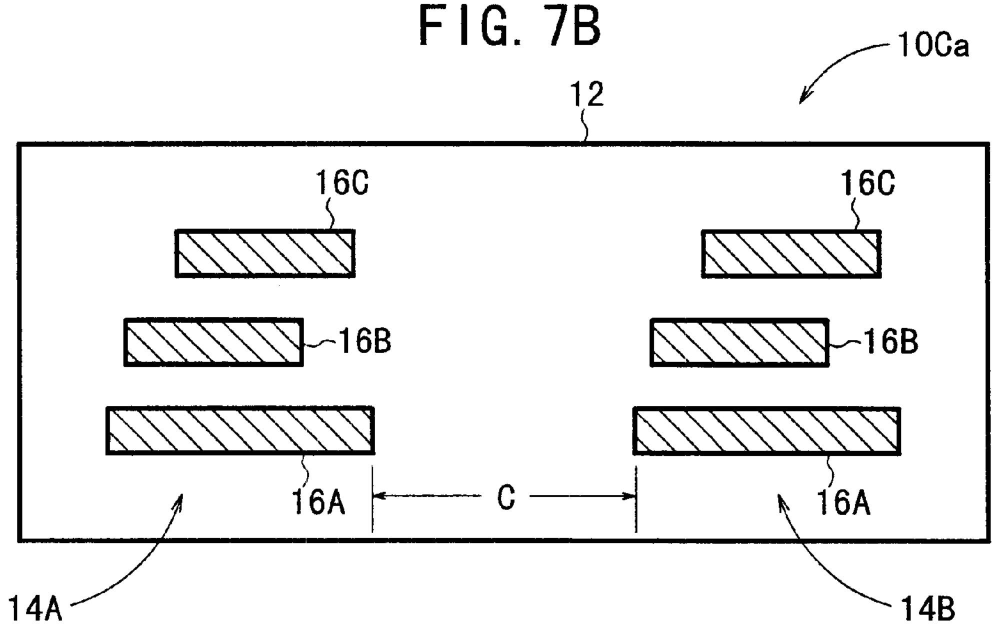
FIG. 7B shows a vertical sectional view illustrating a state in which the stacking deviation occurs.

In the embodiment shown in FIG. 7A, the stacking deviation is caused for the third resonance electrode 16C with respect to the second resonance electrode 16B as shown in FIG. 7B in the actual stacking. However, even in this case, the spacing distance between the resonators 14A, 14B is scarcely changed. Therefore, the variation of characteristic scarcely occurs.

Next, a stacked type dielectric filter 10D according to a fourth embodiment will be explained with reference to FIGS. 8A and 8B. Components or parts corresponding to those shown in FIGS. 7A and 7B are designated by the same reference numerals, duplicate explanation of which will be omitted.

Figure 8A:
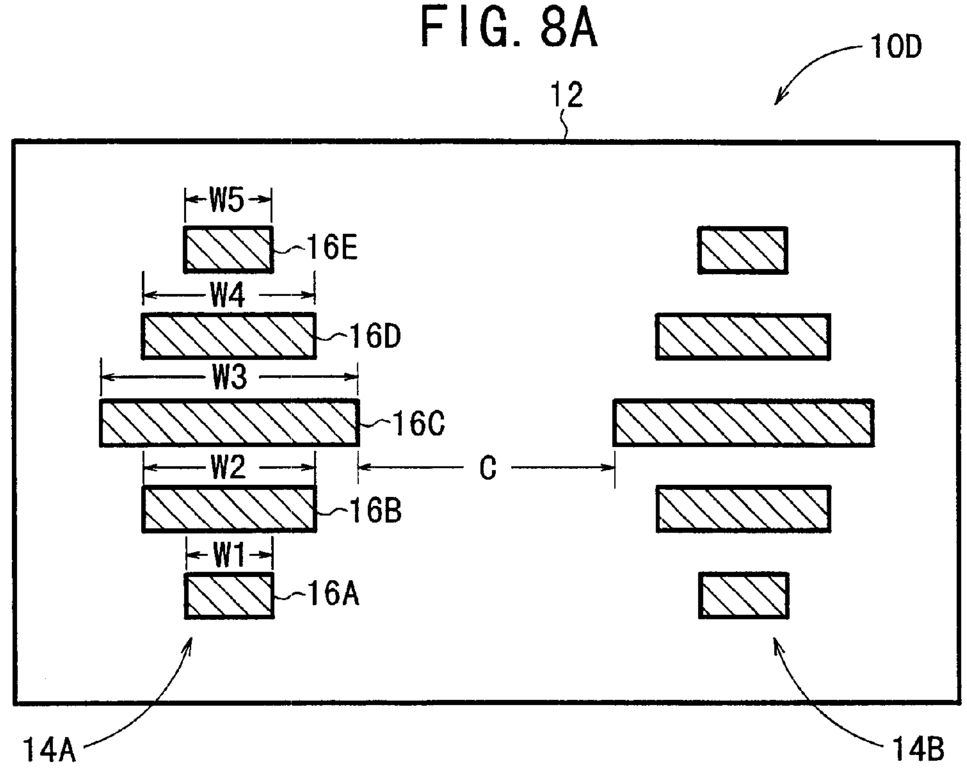
FIG. 8A shows a vertical sectional view illustrating a state in which a stacked type dielectric filter according to a fourth embodiment is cut along the short side of resonance electrodes.

As shown in FIG. 8A, the stacked type dielectric filter 10D according to the fourth embodiment is constructed in approximately the same manner as the stacked type dielectric filters 10B, 10C according to the second and third embodiments. However, the former is different from the latter in that each of resonators 14A, 14B is constructed by five sheets of resonance electrodes (first to fifth resonance electrodes 16A to 16E), and the third resonance electrode 16C of the five resonance electrodes 16A to 16E, which is disposed at the center in the stacking direction, is formed to have a wide width.

Figure 8B:
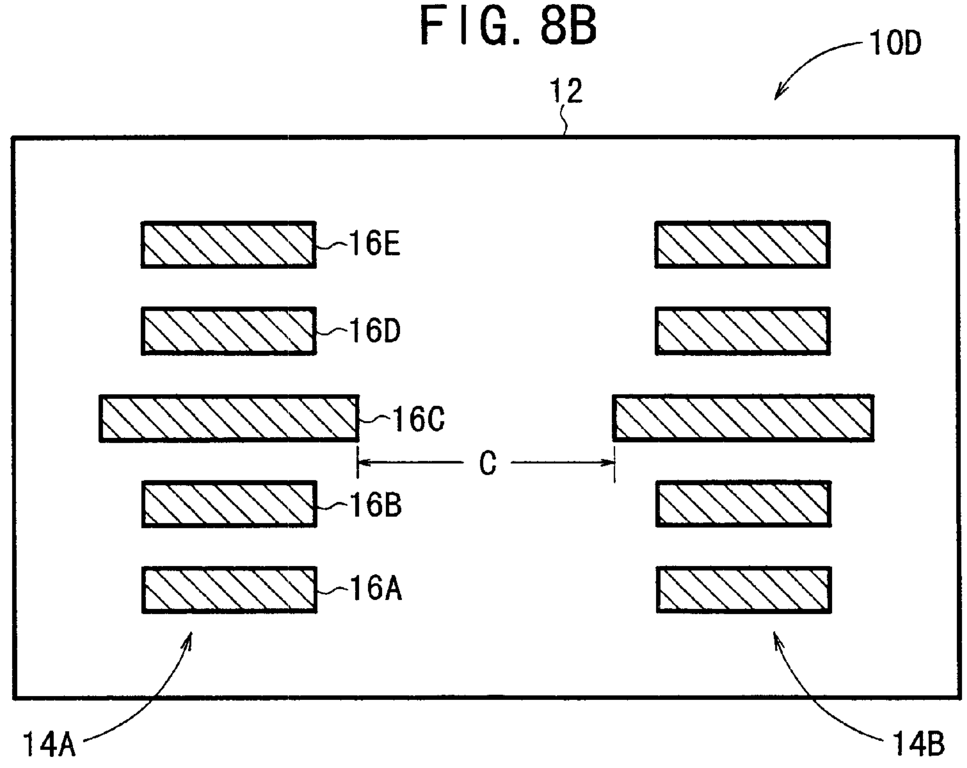
FIG. 8B shows a vertical sectional view illustrating a modified embodiment thereof.

In this arrangement, assuming that respective widths of the first to fifth resonance electrodes 16A to 16E are W1 to W5 respectively, a relationship of $W3>W2\approx W4>W1\approx W5$ may be satisfied as shown in FIG. 8A, or a relationship of $W3>W1\approx W2\approx W4\approx W5$ may be satisfied as shown in FIG. 8B.

Also in the stacked type dielectric filter 10D according to the fourth embodiment, the spacing distance C between the resonators 14A, 14B is dominated by the spacing distance between the wide-width resonance electrodes 16C of the respective resonators 14A, 14B, in the same manner as in the stacked type dielectric filter 10A according to the first embodiment. Even when stacking deviations occur in the plurality of resonance electrodes 16A to 16E, then the spacing distance C between the resonators 14A, 14B is scarcely changed, and the inductive coupling is scarcely changed as well.

An illustrative experiment will now be described. In this illustrative experiment, observation was made for the degree of variation as compared with designed characteristics in the case of occurrence of the stacking deviation concerning Working Example and Comparative Example.

Figure 9A:
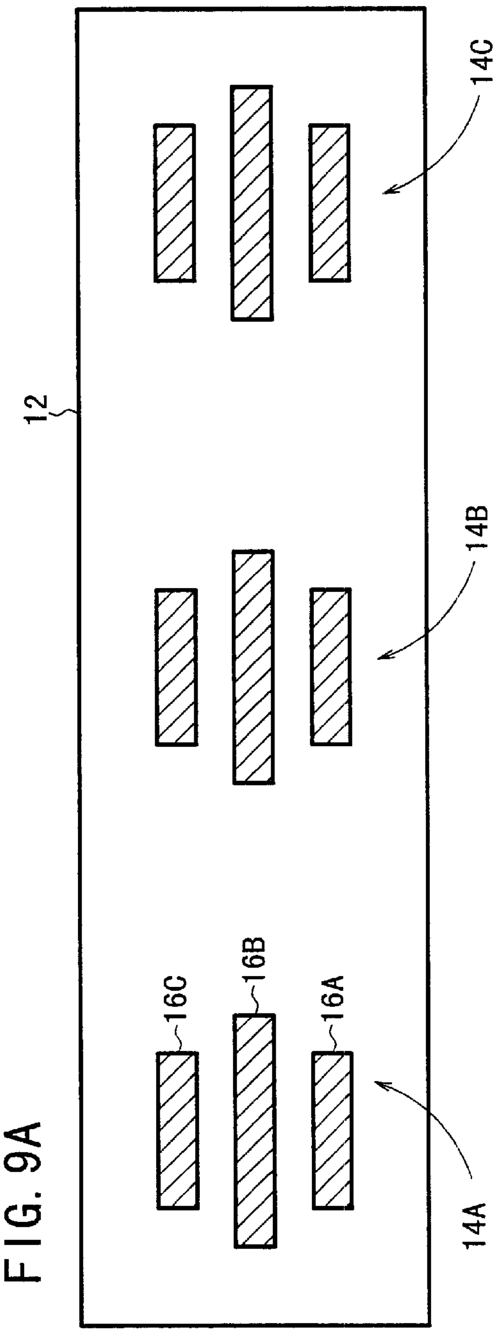
FIG. 9A shows a sectional view illustrating an arrangement of Working Example in an illustrative experiment.

As shown in FIG. 9A, Working Example is based on the use of a stacked type dielectric filter comprising three sets of resonators 14A to 14C arranged in a dielectric substrate 12, in which each of the resonators 14A to 14C comprises three sheets of resonance electrodes 16A to 16C. Especially, the second resonance electrode 16B of the three resonance electrodes 16A to 16C for constructing each of the resonators 14A to 14C, which is located at the center in the stacking direction, is formed to have a wide width. The width of the first and third resonance electrodes 16A, 16C is 0.4 mm, and the width of the second resonance electrode 16B is 0.5 mm.

Figure 9B:
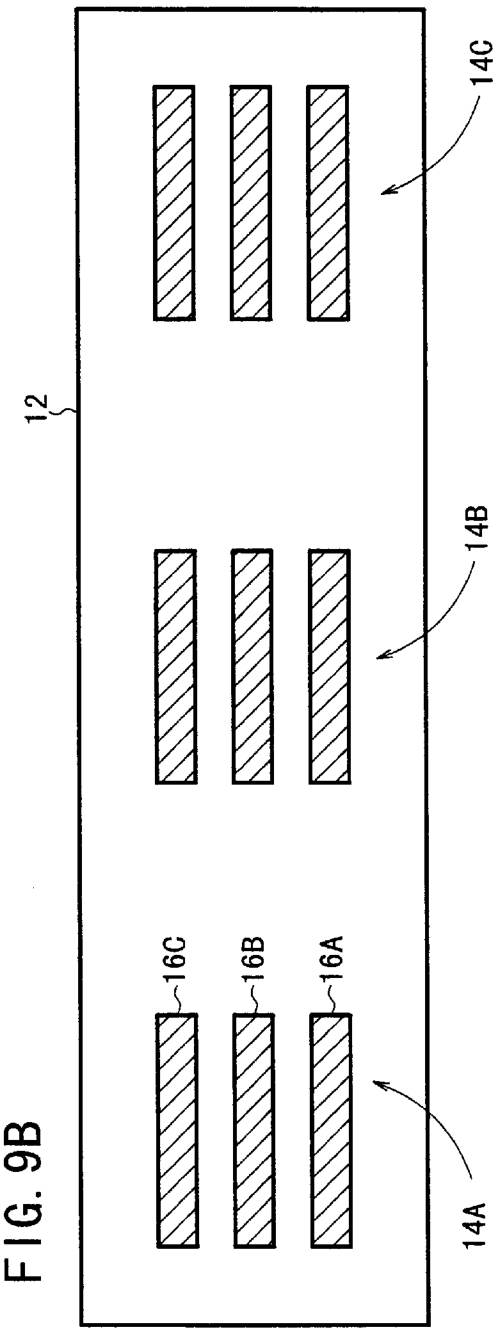
FIG. 9B shows a sectional view illustrating an arrangement of Comparative Example in the illustrative experiment.

As shown in FIG. 9B, Comparative Example is constructed in approximately the same manner as Working Example described above. However, the former is different from the latter in that three sheets of resonance electrodes 16A to 16C for constructing each of resonators 14A to 14C have a substantially identical width (0.5 mm).

The variation of characteristics was plotted for Working Example and Comparative Example, concerning a case of the occurrence of the stacking deviation by 0.05 mm in the rightward direction as viewed in the drawing for the second resonance electrode 16B disposed at the center in the stacking direction.

Figure 10:
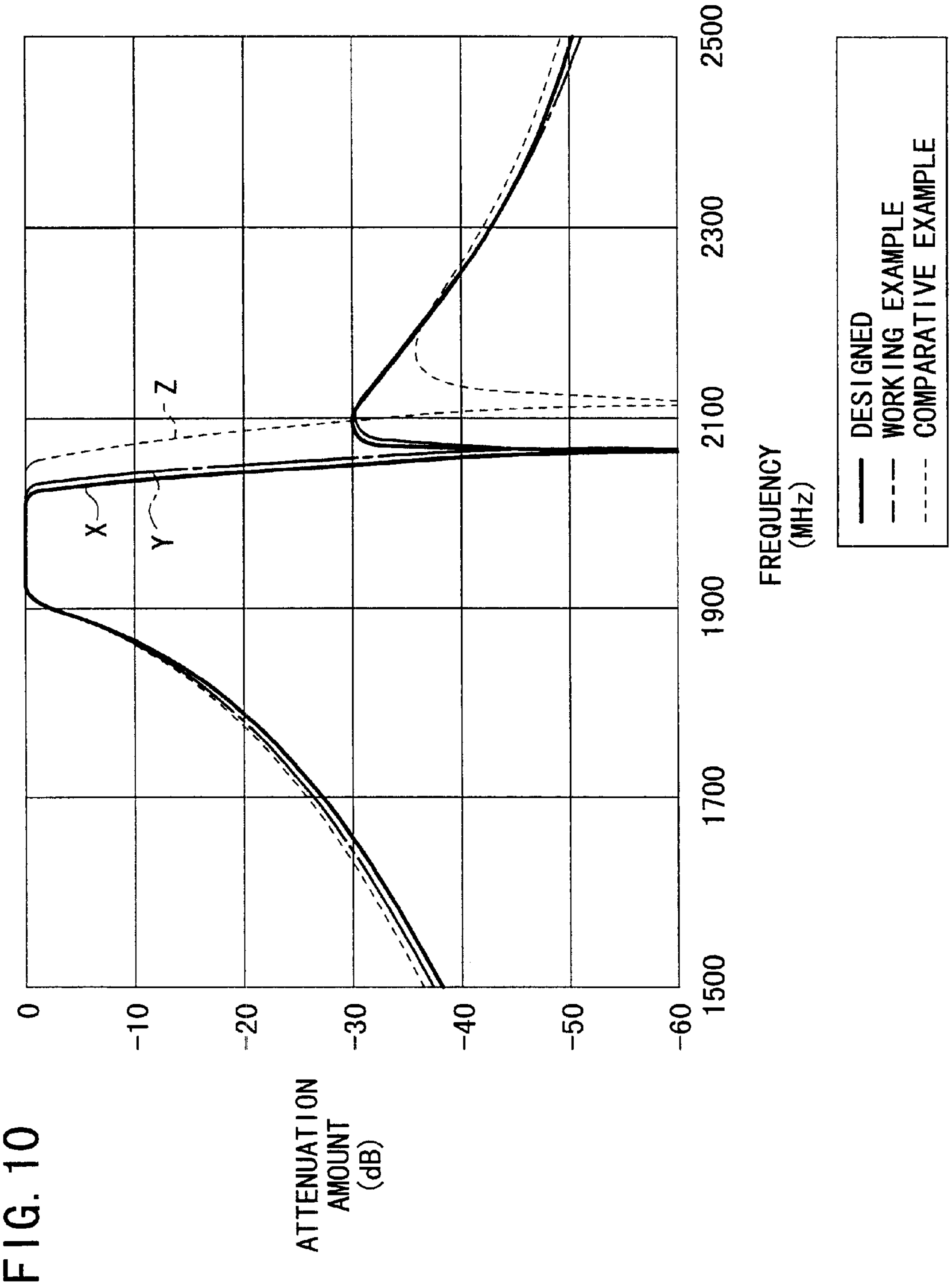
FIG. 10 shows characteristic curves illustrating experimental results (frequency characteristics)

Experimental results are shown in FIG. 10. In FIG. 10, a curve X indicates a designed characteristic, a curve Y indicates a characteristic in Working Example, and a curve Z indicates a characteristic in Comparative Example. According to the experimental results, it is understood that the pass band of the filter is widened as depicted by the curve Z in Comparative Example, in which the inductive coupling is strengthened. On the other hand, in the case of Working Example, as depicted by the curve Y, it is understood that substantially no change occurs as compared with the designed characteristic (see the curve X), and the variation of characteristics is not caused.

It is a matter of course that the stacked type dielectric filter according to the present invention is not limited to the embodiments described above, which may be embodied in other various forms without deviating from the gist or essential characteristics of the present invention.

What is claimed is:

1. A stacked dielectric filter comprising at least two sets of resonators arranged in a dielectric substrate constructed by laminating a plurality of dielectric layers, in which each of said resonators includes a plurality of resonance electrodes superimposed in a stacking direction with dielectric layers being positioned between said resonance electrodes, wherein:

at least one resonance electrode of said plurality of resonance electrodes for constructing each of said resonators is formed to have a wide width as compared to one or more other of said resonance electrodes, said one or more other of said resonance electrodes being positioned such that an outer periphery of each of said one or more other of said resonance electrodes is within outer peripheral edges of said at least one resonance electrode, and wherein respective ends of the plurality of resonance electrodes are directly connected to a common ground electrode on a side surface of said dielectric substrate.

2. The stacked dielectric filter according to claim 1, wherein a stacking deviation amount, which is brought about when said plurality of resonance electrodes for constructing said resonator are stacked so that respective central positions are coincident with one another, is smaller than a protruding amount of said at least one resonance electrode having said wide width with respect to said one or more other of said resonance electrodes.

3. The stacked dielectric filter according to claim 1, wherein a number of said plurality of resonance electrodes for constructing said resonator is an odd number, and said at least one resonance electrode having said wide width is positioned to be the central electrode in the stacking direction.

4. The stacked dielectric filter according to claim 1, wherein said at least one resonance electrode having said wide width is located at a lowermost layer in said stacking direction.

* * * * *